United States Patent
Kim et al.

(12)

(10) Patent No.: US 7,710,193 B2
(45) Date of Patent: May 4, 2010

(54) HIGH VOLTAGE GENERATOR AND WORD LINE DRIVING HIGH VOLTAGE GENERATOR OF MEMORY DEVICE

(75) Inventors: Jae-Il Kim, Kyoungki-do (KR); Chang-Ho Do, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 32 days.

(21) Appl. No.: 11/528,282

(22) Filed: Sep. 28, 2006

(65) Prior Publication Data
US 2007/0069804 A1 Mar. 29, 2007

(30) Foreign Application Priority Data
Sep. 29, 2005 (KR) .............. 10-2005-0090918
Apr. 5, 2006 (KR) .............. 10-2006-0030937

(51) Int. Cl.
*G05F 3/02* (2006.01)
(52) U.S. Cl. .............. 327/536; 363/59
(58) Field of Classification Search .............. 327/536; 363/59, 60
See application file for complete search history.

(56) References Cited

U.S. PATENT DOCUMENTS 5,999,009 A * 12/1999 Mitsui .............. 324/765
6,020,781 A * 2/2000 Fujioka .............. 327/541
6,275,096 B1 * 8/2001 Hsu et al. .............. 327/535
6,278,317 B1 * 8/2001 Hsu et al. .............. 327/536
6,285,622 B1 * 9/2001 Haraguchi et al. .......... 365/226
6,853,567 B2 2/2005 Kwon
7,091,769 B2 * 8/2006 Kwon et al. .............. 327/535
7,253,676 B2 * 8/2007 Fukuda et al. .............. 327/536
2004/0046604 A1 * 3/2004 Kim .............. 327/536
2004/0208026 A1 10/2004 Kwon
2004/0239409 A1 12/2004 Jang et al.

FOREIGN PATENT DOCUMENTS

| JP | 09-294367 A | 11/1997 |
| JP | 2004-147458 | 5/2004 |
| KR | 1998-075589 | 11/1998 |
| KR | 1020030094676 A | 12/2003 |
| KR | 10-2004-0102610 A | 12/2004 |

\* cited by examiner

*Primary Examiner*—Lincoln Donovan
*Assistant Examiner*—Ryan C Jager
(74) *Attorney, Agent, or Firm*—IP & T Law Firm PLC

(57) ABSTRACT

A high voltage generator includes: a detection unit for comparing a reference voltage with a high voltage and detecting a voltage level of the high voltage; an oscillator selection unit for generating a first control signal and a second control signal in response to an output signal of the detection unit and a selection signal corresponding to a data operation mode; an oscillator for generating clock signals having different frequencies in response to the first control signal and the second control signal; and a pumping unit for generating the high voltage by performing a charge pumping operation in response to the clock signals.

11 Claims, 5 Drawing Sheets

HIGH VOLTAGE GENERATOR AND WORD LINE DRIVING HIGH VOLTAGE GENERATOR OF MEMORY DEVICE

FIELD OF THE INVENTION

The present invention relates to a method for designing a semiconductor device; and more particularly, to a high voltage generator and a memory device using the same.

DESCRIPTION OF RELATED ARTS

Recently, an input/output path of a multi bit structure has been designed according to a data operation mode to improve a data transmission speed. In case of using the multi bit structure, the number of data which can be simultaneously read or written by addressing can be great. Accordingly, although semiconductor memory devices have the same data capacity, each of the semiconductor memory devices can have different structures. Particularly, the semiconductor memory devices can have the different structures related to outputting the data. For instance, the number of the data which are input and output during accessing the data once can be set with an x4, x8, or x16 operation mode. Thus, the semiconductor memory device reads or writes the number of the data corresponding to the data operation mode.

Hence, the semiconductor memory device is designed to satisfy all of the x4, x8, and x16 operation modes and can perform an operation process according to each of the different data operation modes. The semiconductor memory device finally operates according to the operation mode selected from the x4, x8, and x16 operation modes.

As for the semiconductor memory device, as an external power supply voltage VDD has been decreased and a high speed operation has been required, a word line WL voltage has been boosted to secure a low voltage margin and a data sensing speed from memory cells has been improved. Generally, in case of a cell including a transistor and a capacitor, the cell transistor is formed with an N-type metal oxide semiconductor (NMOS) transistor having an area smaller than a P-type metal oxide semiconductor (PMOS) transistor.

Accordingly, a high voltage VPP greater than the external power supply voltage VDD as much as the threshold voltage of the cell transistor is used to read and write the logic low data and the logic high data without causing a loss in a data signal. Since the high voltage VPP needs to maintain an electric potential greater than the external power supply voltage VDD, the external power supply voltage VDD is raised to be used as the high voltage VPP in the semiconductor memory device. In most dynamic random access memory (DRAM) devices, the high voltage VPP is generated and used through a charge pumping operation.

FIG. 1 is a diagram illustrating a plurality of typical word lines enabled by a data operation mode.

A bank 10 includes the word lines WL1, WL2 and WL3 enabled according to the different data operation modes, i.e., x4, x8, and x16. If the data operation mode is one of the x4 and x8 operation modes, the word lines WL2 and WL3 are enabled in the bank 10 which is divided into two blocks (e.g., an upper block and a lower block). When the data operation mode is the x16 operation mode, the number of word lines is increased by one compared to when the data operation mode is one of the x4 and x8 operation modes. When the data operation mode is the x16 operation mode, the number of the word lines becomes two times greater than when the data operation mode is one of the x4 and x8 operation modes. A high voltage generator needs to have a driving force two times greater when the data operation mode is the x16 operation mode than when the data operation mode is one of the x4, and x8 operation modes.

FIG. 2 is a block diagram of a typical high voltage generator.

The typical high voltage generator includes a high voltage detection unit 20 for comparing a reference voltage VREF with a high voltage VPP and enabling an oscillator enable signal PPES if the high voltage VPP is lower than the reference voltage VREF, an oscillator 40 for receiving the oscillator enable signal PPES and generating a clock signal OSC having a predetermined frequency, and a high voltage pumping unit 60 for receiving the clock signal OSC generated in the oscillator 40 and performing a charge pumping operation to output the high voltage VPP.

FIG. 3 is a block diagram of a typical arrangement of a plurality of banks and a plurality of high voltage generators.

The first to fourth high voltage generating units 12A, 12B, 12C, and 12D are respectively assigned to the first to fourth banks 10A, 10B, 10C, and 10D. A peripheral circuit 14 is placed in the center of a memory chip.

FIG. 4 is a graph illustrating a width ΔV changing with a voltage level of a high voltage VPP generated in a typical high voltage generator.

The high voltage VPP cannot be uniformly maintained because of a delay due to a response time of the high voltage detection unit 20 (see FIG. 2). Thus, the high voltage VPP fluctuates within a width ΔV.

As explained with respect to FIG. 1, when the data operation mode is the x16 operation mode, the high voltage generator has the driving force two times greater than when the operation mode is one of the x4 and x8 operation modes.

Accordingly, the following two methods are used to correspond to a difference in the driving forces between when the high voltage generator is set based on the x16 operation mode and when the high voltage generator is set based on the x4 or x8 operation mode.

The first method is used when the high voltage generator is set based on the x16 operation mode. The second method is used when high voltage generator is set based on the x4 or x8 operation mode. According to the second method, the half of the high voltage generating units 12A, 12B, 12C, and 12D (herein, only four high voltage generators are shown) are used when the high voltage generator is set based on the x4 or x8 operation modes.

However, when the first method is used, if the response time of the high detection unit 20 is slow, the width ΔV changing with the voltage level of the high voltage VPP with respect to a target voltage VPP_TARGET becomes large since a pumping operation ability of the high voltage generators is greater than when the second method is used.

In case of using the second method, since the high voltage generators are not uniformly arranged throughout a chip when the data operation mode is one of the x4 and x8 operation modes, it is difficult to control portions of the chip apart from each of the high voltage generators.

SUMMARY OF THE INVENTION

It is, therefore, an object of the present invention to provide a high voltage generator, wherein the high voltage generator minimizes a width changing with a voltage level of a high voltage VPP with respect to a target voltage VPP_TARGET by making an amount of pumped electric charges vary depending on a data operation mode.

It is another object of the present invention to provide a memory device having a word line driving high voltage generator placed to minimize a width changing with a voltage level of a high voltage VPP for driving word lines with respect to a target voltage VPP_TARGET by making a period of an oscillator vary depending on an x4, x8 or x16 operation mode.

In accordance with one aspect of the present invention, there is provided a high voltage generator, including: a detection unit for comparing a reference voltage with a high voltage and detecting a voltage level of the high voltage; an oscillator selection unit for generating a first control signal and a second control signal in response to an output signal of the detection unit and a selection signal corresponding to a data operation mode; an oscillator for generating clock signals having different frequencies in response to the first control signal and the second control signal; and a pumping unit for generating the high voltage by performing a charge pumping operation in response to the clock signals.

In accordance with another aspect of the present invention, there is provided a word line driving high voltage generator of a semiconductor memory device capable of processing one of a first operation mode and a second operation mode depending on a data operation mode, and including the number of word lines enabling according to the operation mode, including: a detection unit for comparing a reference voltage with a high voltage and detecting a voltage level of the high voltage; an oscillator selection unit for generating a first control signal and a second control signal in response to an output signal of the detection unit and a selection signal depending on a data operation mode; an oscillator for generating clock signals having different frequencies in response to the first control signal and the second control signal; and a pumping unit for generating the high voltage by performing a charge pumping operation in response to the clock signals.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 5:
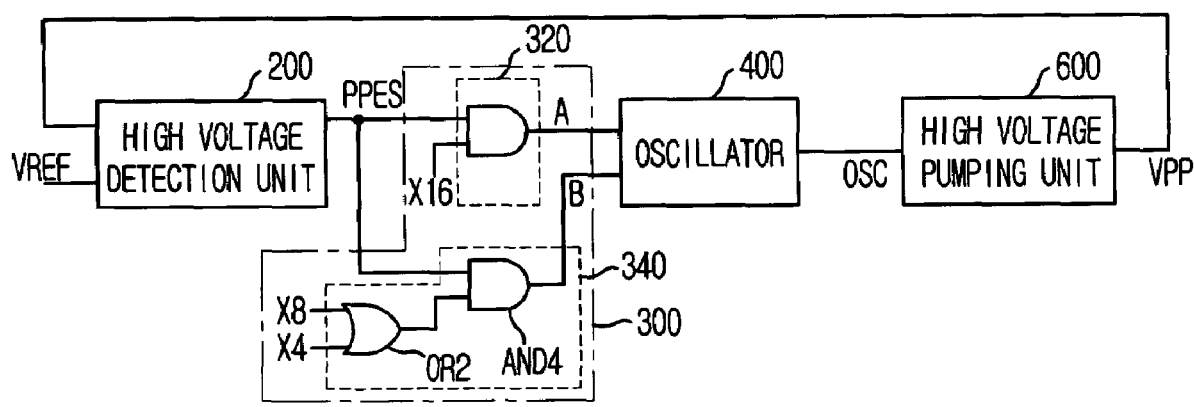
FIG. 5 is a diagram of a high voltage generator in accordance with an embodiment of the present invention.

FIG. 5 is a diagram of a high voltage generator in accordance with an embodiment of the present invention.

The high voltage generator in accordance with the embodiment of the present invention includes a high voltage detection unit 200, an oscillator frequency selection unit 300, an oscillator 400, and a high voltage pumping unit 600.

The high voltage detection unit 200 compares a high voltage VPP with a reference voltage VREF and enables an oscillator enable signal PPES if the high voltage VPP is lower than the reference voltage VREF.

The frequency selection unit 300 outputs a first control signal A or a second control signal B in response to the enabled enable signal PPES and an operation signal based on a data operation mode (e.g., an x4, x8, or x16 operation mode). The x4, x8, and x16 operation modes indicate the number of data input and output during accessing the data once.

The oscillator 400 generates a clock signal OSC having a different frequency in response to the first control signal A or the second control signal B.

The high voltage pumping unit 600 receives the clock signal OSC and performs a charge pumping operation to output the high voltage VPP corresponding to the clock signal OSC.

Detailed explanations of the high voltage detection unit 200 and the high voltage pumping unit 600 will be omitted herein since embodiment of these as a typical high voltage detection unit and a typical high voltage pumping unit, would be understood by people skilled in this art. Hereinafter, the frequency selection unit 300 and the oscillator 400 will be explained in detail.

The frequency selection unit 300 includes a first control signal generating unit 320 comprising an AND gate AND2 receiving the oscillator enable signal PPES and an x16 operation signal x16, and a second control signal generating unit 340 comprising an OR gate OR2 receiving an x4 or x8 operation signal x4 or x8 and an AND gate AND4 receiving an output signal of the OR gate OR2.

The frequency selection unit 300 outputs the first control signal A in response to the oscillator enable signal PPES of the high voltage detection unit 200 and the x16 operation signal x16, and outputs the second control signal B in response to the oscillator enable signal PPES of the high voltage detection unit 200 and the x4 or x8 operation signal.

Figure 6A:
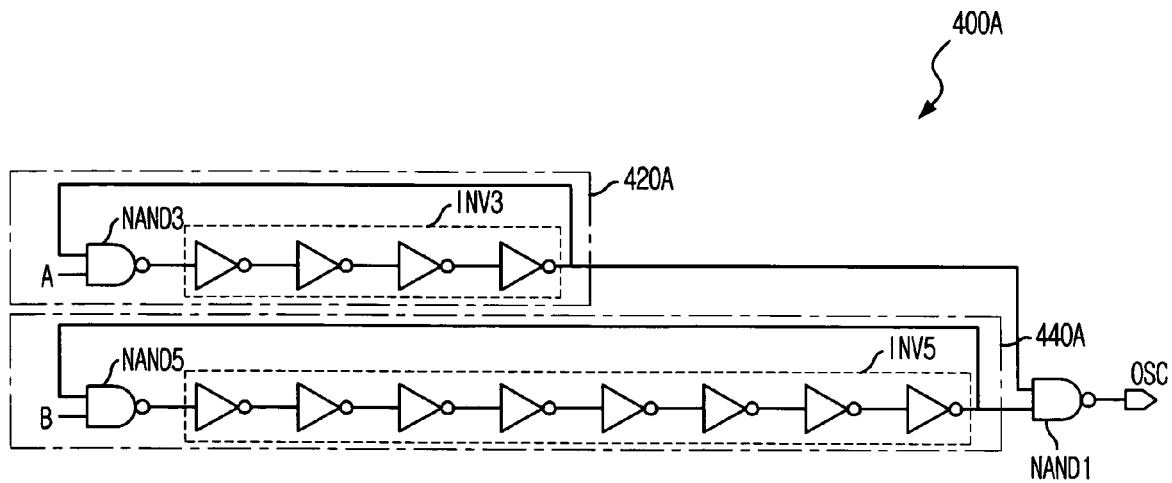
FIGS. 6A to 6C are circuit diagrams of oscillators in accordance with first to third specific embodiments of the present invention.

FIG. 6A is a circuit diagram of an oscillator in accordance with a first specific embodiment of the present invention.

The oscillator 400A includes a first oscillator unit 420A, a second oscillator unit 440A, and an output unit NAND1. The first oscillator unit 420A generates a clock signal with a high frequency in response to a first control signal A. The second oscillator unit 440A generates a clock signal with a frequency lower than the clock signal generated in the first oscillator unit 420A in response to a second control signal. The output unit NAND1 outputs a final output clock signal OSC in response to the output signals of the first oscillator unit 420A and the second oscillator unit 440A.

The first oscillator unit 420A includes a NAND gate NAND3, and the first inverters INV3. The NAND gate NAND3 receives the first control signal A and final output signals of the first inverters INV3. The first inverters INV3 are coupled with each other in series and receive an output signal of the NAND gate NAND3.

The second oscillator unit 440A includes a NAND gate NAND5, and a plurality of second inverters INV5. The NAND gate NAND5 receives the second control signal B and final output signals of the second inverters INV5. The second inverters INV5 are coupled with each other in series and receive an output signal of the NAND gate NAND5. Also, the second inverters INV5 have more stages than the first inverters INV3.

The output unit NAND1 includes an NAND gate NAND1 receiving the output signals of the first inverters INV3 and the second inverters INV5.

Figure 6B:
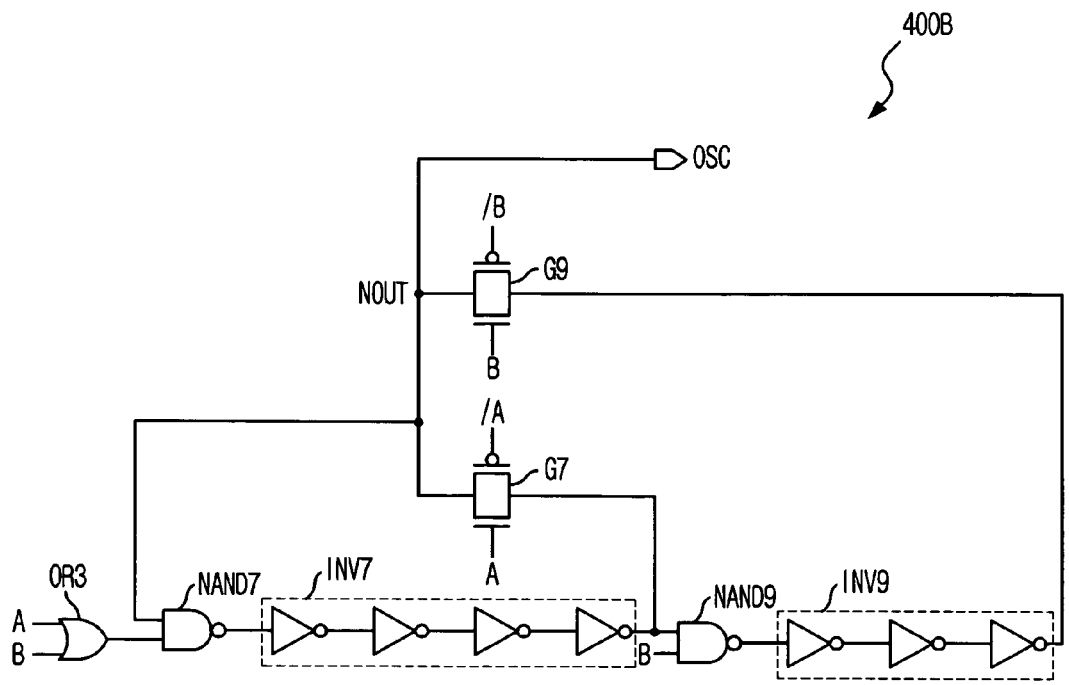

FIG. 6B is a circuit diagram of an oscillator in accordance with a second specific embodiment of the present invention.

The oscillator 400B in accordance with the second embodiment of the present invention includes an OR gate OR3, a NAND gate NAND7, a plurality of first inverters INV7, a NAND gate NAND9, a plurality of second inverters INV9, a first pass gate G7, and a second pass gate G9. The OR gate OR3 receives a first control signal A and a second control signal B. The NAND gate NAND7 receives an output signal of the OR gate OR3 and a final output clock signal OSC. The first inverters INV7 are coupled with each other in series and receive an output signal of the NAND gate NAND7. The NAND gate NAND9 receives output signals of the first inverters INV7 and the second control signal B. The second inverters INV9 are coupled with each other in series and receive an output signal of the NAND gate NAND9. The first pass gate G7 transfers the output signals of the first inverters INV7 to the NAND gate NAND7 in response to the first control signal A and a reverse signal /A of the first control signal. The second pass gate G9 transfers the output signals of the second inverters INV9 to the NAND gate NAND7 in response to the second control signal and a reverse signal /B of the second control signal.

Figure 6C:
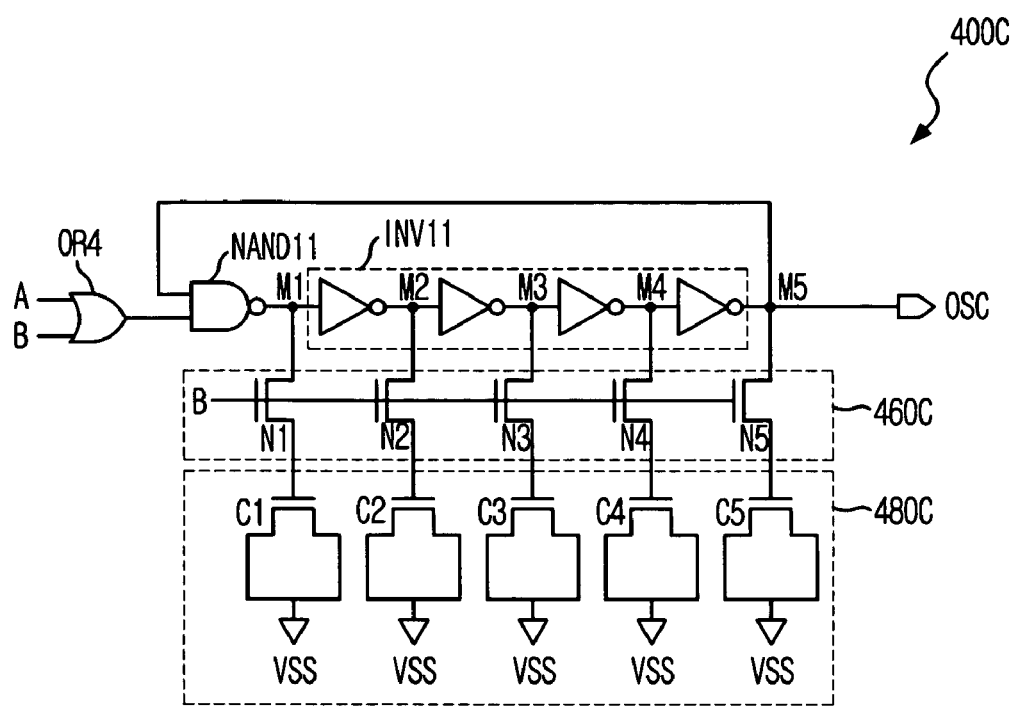

FIG. 6C is a circuit diagram of an oscillator in accordance with a third specific embodiment of the present invention.

The oscillator 400C includes an OR gate OR4, a NAND gate NAND11, a plurality of inverters INV11, a plurality of N-type metal oxide semiconductor (NMOS) transistors N1, N2, N3, N4, and N5, and a plurality of NMOS capacitors C1, C2, C3, C4, and C5. The OR gate OR4 receives a first control signal A and a second control signal B. The NAND gate NAND11 receives an output signal of an OR gate OR4 and a final output clock signal OSC. The inverters INV11 are coupled to each other in series and receive an output signal of the NAND gate NAND11. One terminal of each of the NMOS transistors N1, N2, N3, N4 and N5 is coupled to respective nodes M1, M2, M3, M4, and M5 of the inverters INV11 and receive the second control signal B. The NMOS capacitors C1, C2, C3, C4, and C5 are disposed between a ground voltage terminal VSS and the other terminal of the respective N1, N2, N3, N4, and N5.

The oscillators 400A, 400B, and 400C receive the first control signal A or the second control signal B according to the data operation mode (e.g., the x4, x8 or x16 operation mode) to generate a different oscillator frequency OSC. In other words, if the data operation mode is the x16 operation mode, the first control signal A is enabled. If the data operation mode is one of the x4 and x8 operation modes, the second control signal B is enabled. If the oscillators 400A, 400B, and 400C receive the first control signal A, a clock signal having a frequency two times greater than that generated while the oscillators 400A, 400B, and 400C receive the second control signal B is generated. The frequency of the clock signal generated by the first control signal A is two times greater than the frequency of the clock signal generated by the second control signal B.

Referring to FIG. 5, the high voltage pumping unit 600 performs the charge pumping operation corresponding to the clock signal OSC to generate the high voltage VPP. The high voltage pumping unit 600 receiving the clock signal OSC generated in response to the first control signal A operates with a speed two times faster than a normal speed. That is, the high voltage pumping unit 600 pumps an amount of electric charges two times greater than a normal amount to output the high voltage VPP. The high voltage pumping unit 600 receiving the clock signal OSC generated in response to the second control signal B operates with the normal speed. Accordingly, the amount of the electric charges pumped by the high voltage pumping unit 600 to output the high voltage VPP is reduced by the half.

Figure 7:
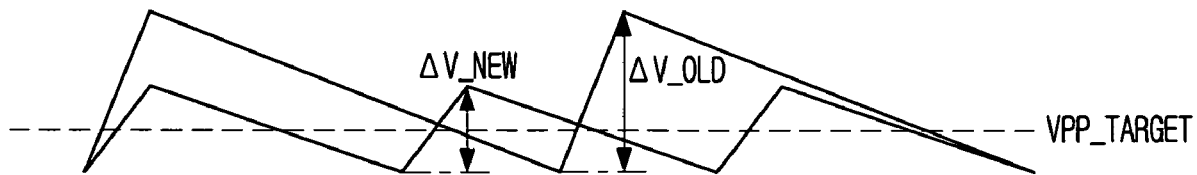
FIG. 7 is a graph illustrating a width ΔV changing with a voltage level of a high voltage VPP generated in a high voltage generator with respect to a target voltage VPP_TARGET in accordance with an embodiment of the present invention.

FIG. 7 is a graph illustrating a width $\Delta V\_NEW$ changing with a voltage level of a high voltage VPP generated in a high voltage generator with respect to a target voltage VPP_TARGET in accordance with an embodiment of the present invention.

Figure 1:
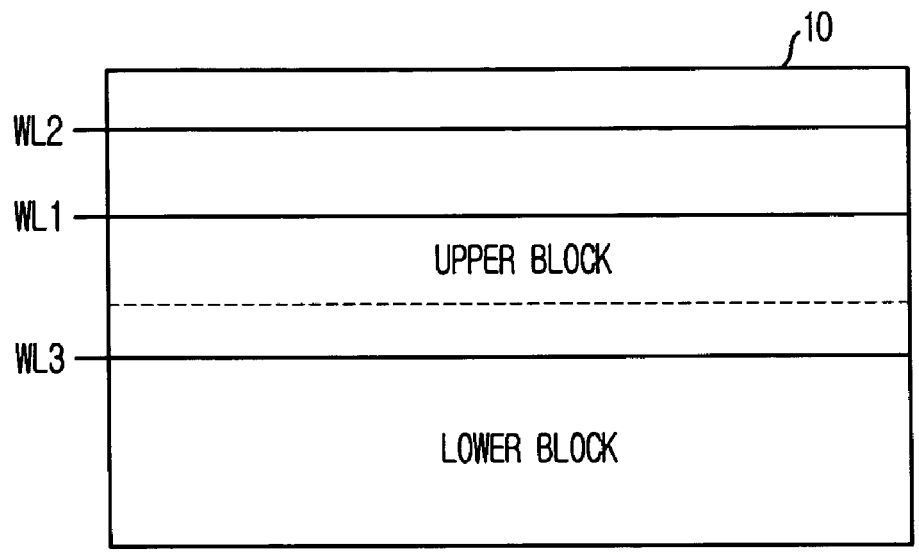
FIG. 1 is a diagram illustrating a plurality of typical word lines enabled by a data operation mode.
Figure 2:
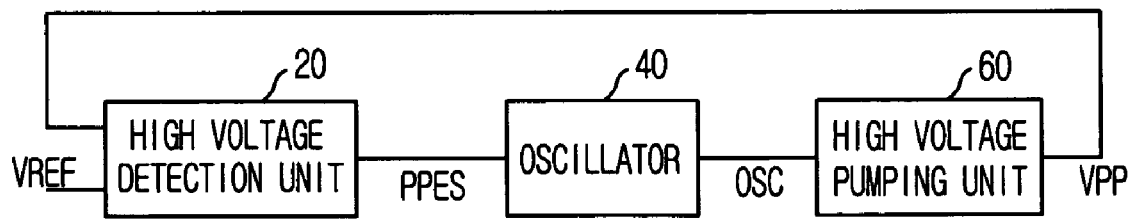
FIG. 2 is a block diagram of a typical high voltage generator.
Figure 3:
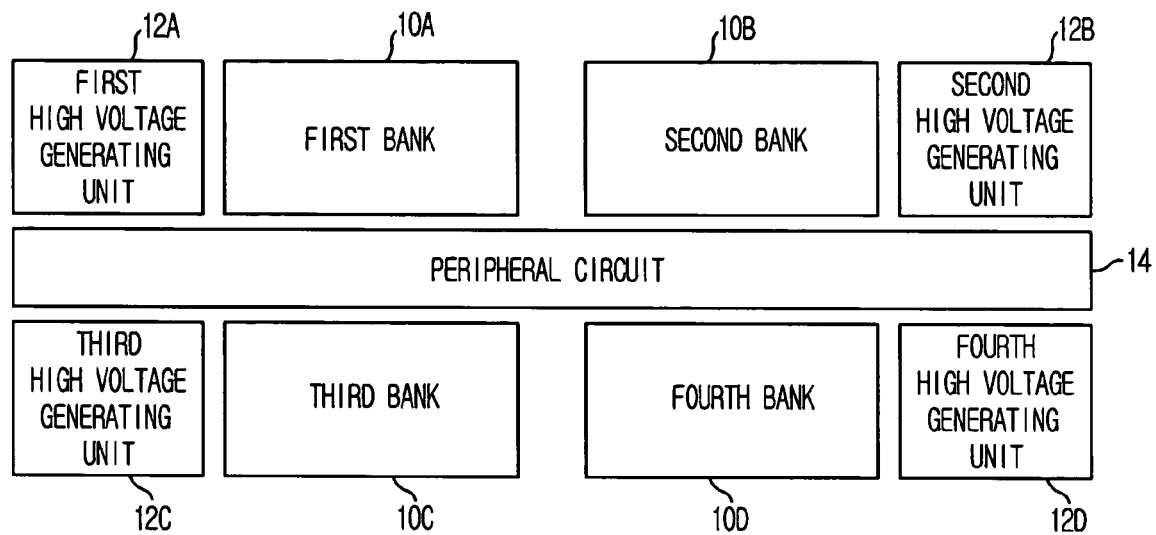
FIG. 3 is a block diagram of a typical arrangement of a plurality of banks and a plurality of high voltage generators.
Figure 4:
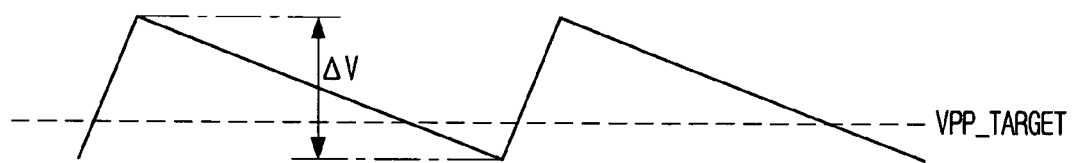
FIG. 4 is a graph illustrating a width ΔV changing with a voltage level of a high voltage VPP generated in a typical high voltage generator.

In a typical high voltage generator, when a data operation mode is one of x4 and x8 operation modes, if a response time of the high voltage detection unit 20 (see FIG. 2) is slow, an amount of electric charges pumped once is large because the typical high voltage generator is designed based on an x16 operation mode. Accordingly, there is a considerable width $\Delta V\_OLD$ changing with a voltage level of a high voltage VPP with respect to the target voltage VPP_TARGET.

However, when the high voltage generator is designed according to this embodiment of the present invention, if a response time of the high voltage detection unit 200 (see FIG. 5) is the same as the typical high voltage detection unit 20 (see FIG. 2), an amount of electric charges corresponding to the x4 or the x8 operation mode is pumped to output the high voltage VPP. Accordingly, there can be a reduced width $\Delta V\_NEW$ changing with a voltage level of the high voltage VPP with respect to the target voltage VPP_TARGET.

The high voltage generators according to this embodiment of the present invention supply different amounts of electric charges according to the different data operation modes (e.g., the x4, x8 or x16 operation mode). Accordingly, the amount of electric charges to generate the high voltage VPP to each of the banks is uniformly supplied and thus, the high voltage generators corresponding to all of the banks can operate regardless of the x4, x8, and x16 operation modes. The semiconductor memory device including the high voltage generators uses all of the high voltage generators to enable the number of word lines corresponding to the x4, x8, and x16 operation modes.

According to this embodiment of the present invention, a width changing with a voltage level of a high voltage VPP with respect to a target voltage V_TARGET is reduced to obtain the high voltage VPP. Also, a plurality of high voltage generators are uniformly arranged to a plurality of banks and thus, it is possible to stably control all of the banks. Furthermore, regardless of the operation modes, all of the high voltage generators are used and thus, efficiency in circuits of the semiconductor memory device can be improved.

The present application contains subject matter related to the Korean patent application No. KR 2005-0090918, and 2006-0030937, respectively filed in the Korean Patent Office on Sep. 29, 2005, and Apr. 5, 2006 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A high voltage generator, comprising:
a detection unit for comparing a reference voltage with a high voltage and detecting a voltage level of the high voltage;
an oscillator selection unit for generating a first control signal or a second control signal in response to an output signal of the detection unit and a selection signal representing a data operation mode, wherein the data operation mode is determined depending on the number of data input and output during accessing the data via word lines at once;
an oscillator for generating clock signals having different frequencies in response to the first control signal or the second control signal; and
a pumping unit for generating the high voltage by performing a charge pumping operation in response to the clock signals,
wherein the oscillator includes:
an OR gate for receiving the first control signal and the second control signal;
a first NAND gate for receiving outputs of the OR gate as one input;
a plurality of inverters coupled to an output terminal of the first NAND gate in series and receiving a final output coupled to the other input terminal of the first NAND gate;
a plurality of metal oxide semiconductor (MOS) transistors including one terminal thereof coupled to each node of the inverters coupled in series and receiving the second control signal through a gate; and
a plurality of MOS capacitors coupled between a ground voltage terminal and the other terminal of the respective MOS transistor.

2. The high voltage generator of claim 1, wherein the oscillator selection unit enables the first control signal at a first mode requiring a large driving force, and enables the second control signal at a second mode requiring a small driving force.

3. The high voltage generator of claim 2, wherein the oscillator generates the clock signal having a higher frequency at the first mode than at the second mode.

4. The high voltage generator of claim 2, wherein the oscillator selection unit comprises:
a first control signal generating unit for generating the first control signal in response to a first selection signal corresponding to the output signal of the detection unit and the first mode; and
a second control signal generating unit for generating the second control signal in response to a second selection signal corresponding to the output signal of the detection unit and the second mode.

5. A word line driving high voltage generator of a semiconductor memory device capable of processing one of a first operation mode and a second operation mode depending on a data operation mode, and including the number of word lines enabling according to the operation mode, comprising:
a detection unit for comparing a reference voltage with a high voltage and detecting a voltage level of the high voltage;
an oscillator selection unit for generating a first control signal or a second control signal in response to an output signal of the detection unit and a selection signal representing a data operation mode, wherein the data operation mode is determined depending on the number of data input and output during accessing the data at once;
an oscillator for generating clock signals having different frequencies in response to the first control signal or the second control signal; and
a pumping unit for generating the high voltage by performing a charge pumping operation in response to the clock signals,
wherein the oscillator includes:
an OR gate for receiving the first control signal and the second control signal;
a first NAND gate for receiving outputs of the OR gate as one input;
a plurality of inverters coupled to an output terminal of the first NAND gate in series and receiving a final output coupled to the other input terminal of the first NAND gate;
a plurality of metal oxide semiconductor (MOS) transistors including one terminal thereof coupled to each node of the inverters coupled in series and receiving the second control signal through a gate; and
a plurality of MOS capacitors coupled between a ground voltage terminal and the other terminal of the respective MOS transistor.

6. The word line driving high voltage generator of claim 5, wherein the oscillator selection unit enables the first control signal at the first operation mode driving the large number of the word lines, and enables the second control signal at the second operation mode driving the small number of word lines.

7. The word line driving high voltage generator of claim 6, wherein the oscillator generates the clock signal having a higher frequency at the first mode than at the second mode.

8. The word line driving high voltage generator of claim 6, wherein the oscillator selection unit comprises:
a first control signal generating unit for generating the first control signal in response to a first selection signal corresponding to the output signal of the detection unit and the first mode; and
a second control signal generating unit for generating the second control signal in response to a second selection signal corresponding to the output signal of the detection unit and the second mode.

9. The word line driving high voltage generator of claim 5, the word line driving high voltage generator disposed by each of a plurality of banks included in the semiconductor memory device and driving the word lines depending on one of the first mode and the second mode.

10. The word line driving high voltage generator of claim 5, wherein the first mode is an x16 operation mode of the data operation mode.

11. The word line driving high voltage generator of claim 5, wherein the second mode is one of x4 and x8 operation modes of the data operation mode.

* * * * *